(12) United States Patent
Han et al.

(10) Patent No.: US 11,081,450 B2
(45) Date of Patent: Aug. 3, 2021

(54) RADIATION SHIELD AROUND A COMPONENT ON A SUBSTRATE

(71) Applicant: Intel Corporation, Santa Clara, CA (US)

(72) Inventors: Dong-Ho Han, Beaverton, OR (US); Jaejin Lee, Beaverton, OR (US); Je-Young Chang, Phoenix, AZ (US); Jerrod Peterson, Hillsboro, OR (US); Mark Carbone, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/585,052

(22) Filed: Sep. 27, 2019

(65) Prior Publication Data

US 2020/0027844 A1     Jan. 23, 2020

(51) Int. Cl.
| | |
|---|---|
| *H01L 23/552* | (2006.01) |
| *H01L 21/48* | (2006.01) |
| *H01L 23/367* | (2006.01) |
| *H01L 23/498* | (2006.01) |

(52) U.S. Cl.
CPC ........ *H01L 23/552* (2013.01); *H01L 21/4875* (2013.01); *H01L 23/3675* (2013.01); *H01L 23/49838* (2013.01)

(58) Field of Classification Search
CPC ........... H01L 23/552; H01L 2223/6677; H01L 23/3675; H01L 2224/32245; H01L 23/49838; H01L 23/66; H01L 23/36; H01L 23/42; H01L 2924/15311; H01L 2224/2929; H01L 2924/16153; H01L 2224/72; H01L 21/4875

See application file for complete search history.

(56) References Cited

U.S. PATENT DOCUMENTS

| | | | |
|---|---|---|---|
| 5,566,052 A * | 10/1996 | Hughes | ................. H01L 23/367 174/354 |
| 7,164,587 B1 | 1/2007 | Garnett et al. | |
| 7,254,032 B1 | 8/2007 | Xue et al. | |
| 7,968,999 B2 | 6/2011 | Celik et al. | |
| 8,669,646 B2 | 3/2014 | Tabatabai et al. | |
| 2003/0025180 A1 | 2/2003 | Alcoe et al. | |
| 2019/0004571 A1 | 1/2019 | Sahu et al. | |

OTHER PUBLICATIONS

Extended European Search Report in EP Application No. 20182213.7 dated Nov. 27, 2020, 9 pages.

* cited by examiner

*Primary Examiner* — Jasmine J Clark
(74) *Attorney, Agent, or Firm* — Patent Capital Group

(57) ABSTRACT

Particular embodiments described herein provide for an electronic device that can be configured to include a substrate, a radiation source on the substrate, a ground on the substrate, where the ground is located around the radiation source, and a heat spreader over the radiation source, where the heat spreader includes one or more ground coupling mechanisms that are in contact with the ground on the substrate. The one or more ground coupling mechanisms in contact with the ground on the substrate create a radiation shield that at least partially keeps radiation from the radiation source from extending past the substrate.

20 Claims, 15 Drawing Sheets

RADIATION SHIELD AROUND A COMPONENT ON A SUBSTRATE

TECHNICAL FIELD

This disclosure relates in general to the field of computing, and more particularly, to a radiation shield around a component on a substrate.

BACKGROUND

Emerging trends in systems place increasing performance demands on the system. The increasing performance demands can cause radiating noise level and thermal increases in the system. The radiating noise level and thermal increases can cause a reduction in device performance, a reduction in the lifetime of a device, and/or delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
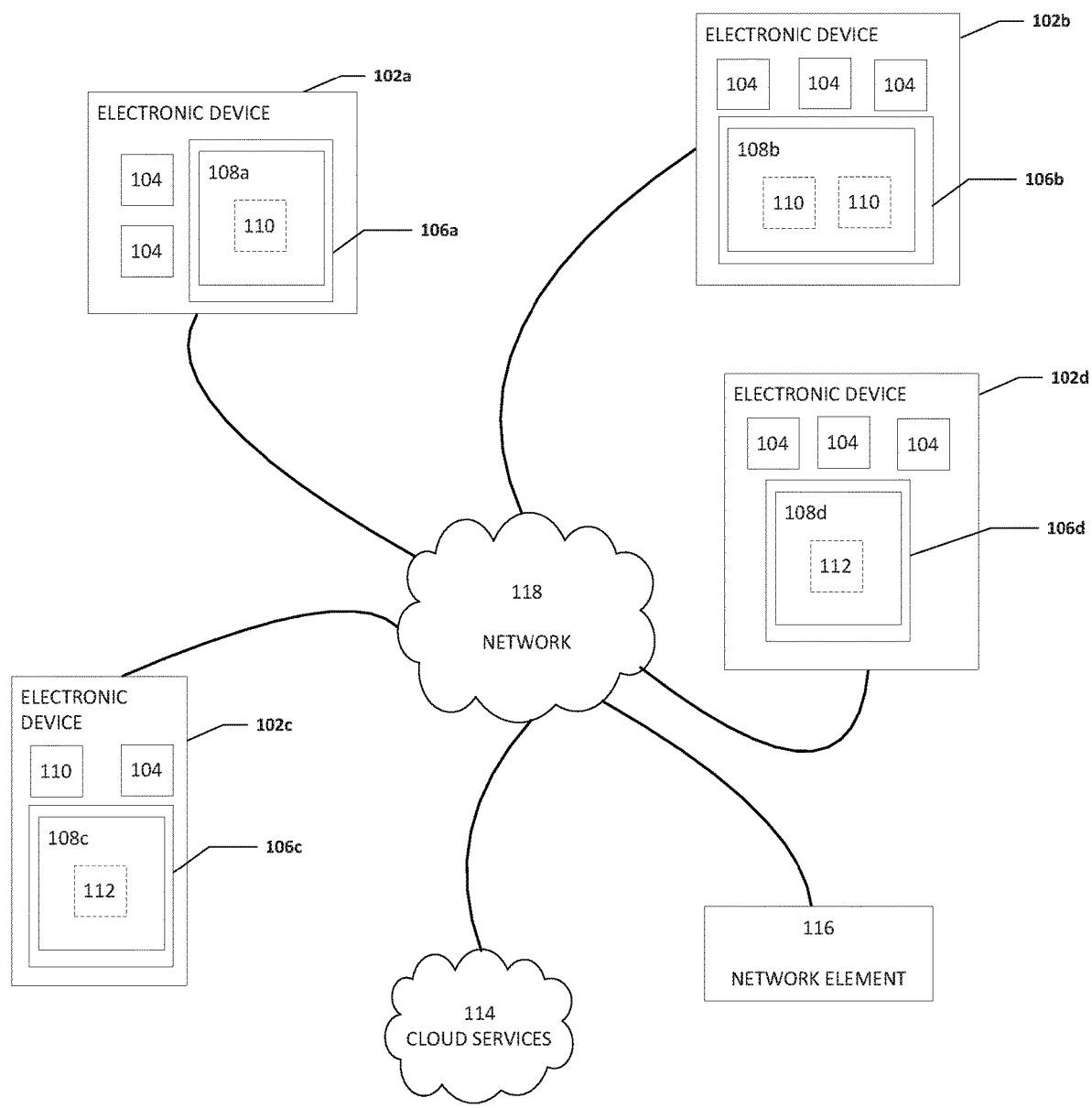
FIG. 1 is a simplified block diagram of a system to enable a radiation shield around a component on a substrate, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a radiation shield around a component on a substrate. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "directly on" a second layer is in direct contact with that second layer. Similarly, unless explicitly stated otherwise, one feature disposed between two features may be in direct contact with the adjacent features or may have one or more intervening layers.

Implementations of the embodiments disclosed herein may be formed or carried out on or over a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

FIG. 1 is a simplified block diagram of an electronic device configured with a radiation shield around a component on a substrate, in accordance with an embodiment of the present disclosure. In an example, an electronic device can include one or more radiation shields coupled to a substrate. For example, as illustrated in FIG. 1, electronic device 102*a* includes one or more electronics 104, a substrate 106*a*, a radiation shield 108*a*, and a radiation source 110. Radiation source 110 can be on or over substrate 106*a* and radiation shield 108*a* can be over radiation source 110 to help contain or mitigate the radiation from radiation source 110 from extending past substrate 106*a* or at least partially contain or mitigate the radiation from radiation source 110 from extending past substrate 106*a*. In addition, electronic device 102*b* includes one or more electronics 104, a substrate 106*b*, a radiation shield 108*b*, and two or more radiation sources 110. Radiation sources 110 can be on or over substrate 106*b* and radiation shield 108*b* can be over radiation sources 110 to help contain or mitigate the radiation from radiation sources 110 from extending past substrate 106*b* or at least partially contain or mitigate the radiation from radiation source 110 from extending past substrate 106*b*.

Also, electronic device 102c includes one or more electronics 104, a substrate 106c, a radiation shield 108c, radiation source 110, and a radiation sensitive device 112. Radiation sensitive device 112 can be on or over substrate 106c and radiation shield 108c can be over radiation sensitive device 112 to help shield radiation sensitive device 112 from the radiation of radiation sources 110. Further, electronic device 102d includes one or more electronics 104, a substrate 106d, a radiation shield 108d, and radiation sensitive device 112. Radiation sensitive device 112 can be on or over substrate 106d and radiation shield 108d can be over radiation sensitive device 112 to help shield radiation sensitive device 112 from the radiation from radiation sources outside of electronic device 102d. Each of electronic devices 102a-120d may be in communication with each other, cloud services 114, and/or network element 116 using network 118. In some examples, one or more of electronic devices 102a-102d may be standalone devices and not connected to network 118 or another device.

Each of radiation shields 108a-108d can be configured to couple to a corresponding substrate using a ground on the substrate and to shield one or more electronic components from radiation from a radiation source. The radiation may be electromagnetic radiation, internal and external Wi-Fi and cellular radio-frequency radiation, high speed input/output (I/O) trace/connector digital noise radiation, switching voltage regulator radiation, or some other type of radiation that can have an undesirable effect on one or more components of an electronic device. For example, electromagnetic interference (EMI) and radio-frequency interference (RFI) affect almost every electronic device, especially mobile compute devices. System on a chip (SoC) packages are both a source of electromagnetic radiation and radio-frequency radiation and are susceptible to EMI/RFI from adjacent sources. For example, when a smartphone is placed on or near a keyboard of a laptop, performance of the laptop is often impacted (e.g., laptop screen flicker, CPU hang, reboot of the system, etc.).

In an example, some SoC packages include a metal stiffener to control package mechanical warpage. The stiffener can be electrically grounded to the package ground plane (Vss). A heat spreader can include an electrical contact and the electrical contacts between the grounded stiffener and the heat spreader can be used to create a Faraday cage, to help contain or mitigate the radiation from one or more radiation sources from extending past a substrate that includes the one or more radiation sources, to help shield one or more radiation sensitive devices from the radiation from one or more radiation sources, to isolate dies/package from radio antennas and exterior noises, and/or to shield both the SoC package and dies outside of the SoC. The term "heat spreader" includes a cold plate, a heatsink, a vapor chamber, a spreader plate, or some other type of thermal solution or thermal management system that transfers heat.

In a specific example, the heat spreader can include spring tips that are added around the periphery of the substrate or die side of the heat spreader. The heat spreader can include several classes of electro-mechanical connections (spring tips, spring fingers, tab/bump geometry, metal foam, EMI gasket, etc.). When the heat spreader is coupled to a grounded stiffener package, the springs will touch the package stiffener and make electrical contacts. This structure creates a package-level Faraday shielding cage that blocks die and package radiation and is able to offer shielding solutions for SoCs and disaggregated SoCs/packages.

It is to be understood that other embodiments may be utilized and structural changes may be made without departing from the scope of the present disclosure. Substantial flexibility is provided in that any suitable arrangements and configuration may be provided without departing from the teachings of the present disclosure.

Elements of FIG. 1 may be coupled to one another through one or more interfaces employing any suitable connections (wired or wireless), which provide viable pathways for network (e.g., network 118, etc.) communications. Additionally, any one or more of these elements of FIG. 1 may be combined or removed from the architecture based on particular configuration needs. Network 118 may include a configuration capable of transmission control protocol/Internet protocol (TCP/IP) communications for the transmission or reception of packets in a network. Each of electronic devices 102a-102d may also operate in conjunction with a user datagram protocol/IP (UDP/IP) or any other suitable protocol where appropriate and based on particular needs.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. One way to increase performance and function is to increase the density of the devices and systems and pack more computing elements into the devices and systems. However, the increase in computing elements causes an increase in the EMI and RFI. EMI and RFI affect almost every electronic device, especially mobile compute devices. In addition, SoC packages are both a source of electromagnetic and radio-frequency radiation and are susceptible to EMI/RFI from adjacent sources.

Die and package radiation have been identified as RFI risk factors. In addition, radio frequency (RF) signals from internal radios and external smartphones in proximity to personal computers have interfered with the SoCs and caused basic functionality issues, including display flickering and system hang/reboot. Some SoC designs introduce disaggregation and multichip package (MCP) using EMIB which can increase both RF interference and immunity risk. Also, scalable package-level shielding techniques (simultaneously shielding both the package and the dies) are required for some Internet of things (IoT), data centers, SoCs, and seven (7)/ten (10) nm disaggregated products.

In some systems, the package layer-count increases to provide a package surface shielding with a ground layer at the expense of package cost and Z-height. However, this can be insufficient because of multiple-die radiation. In addition, package surface shielding with an additional ground layer reduces RF noise radiation/coupling at the expense of package cost and Z-height increases. In other systems, a conductive coating may be used. However, conductive coating, such as metal sputtering, is considered to be prohibitively-expensive and is an uncertified manufacturing process for SoC applications and high volume manufacturing.

In other systems, an on-board shield solution may be used to implement a Faraday cage with a motherboard and PCB ground contacts. While on-board shielding solutions are relatively common, they require good ground stitching between the Faraday cage and motherboard and PCB ground contacts. In general, about 2.5 to about five (5) mm ground stitching space (about X/20 to about X/10) is required to provide good shielding effectiveness up to about five (5) to about six (6) GHz WiFi channels. This requirement is impossible to meet for Type-3 PCBs and for compact size shielding solutions, especially for SoCs with high-density interconnects. Increasing the size of shielding for its placement around less dense PCB areas can cause mechanical warp, height increase, and thermal contact issues. The shielding effectiveness significantly relies on MB PCB designs and technologies (e.g., Type-3 PCB vs. Type-4 PCB). The on-board shielding solutions are applicable only for Type-4 PCBs, which are higher cost than Type-3 and are used only for a small number of premium PCs. High volume PCs are designed with Type-3 PCBs. What is needed is a radiation shield that can be coupled to a substrate such that the radiation shield is part of an SoC package.

A system to create a radiation shield around a component on a substrate, as outlined in FIG. 1, can resolve these issues (and others). In an example, a ground coupling mechanism on a heat spreader can be secured to a ground on a substrate to create a radiation shield around a component on the substrate. In a specific example, the radiation shield may be part of a heat spreader for the component and the heat spreader can be secured to a substrate to create a radiation shield around the component on the substrate. In some examples, the component is a radiation source. In other examples, the component is susceptible to radiation. In a specific implementation, the heat spreader secured to the substrate creates a Faraday cage to shield EMI and/or RFI radiation.

The system can allow for one or more ground coupling mechanisms between the ground on the substrate and the heat spreader. Each of the one or more ground coupling mechanisms can be electrically conductive and mechanically compliant. The term "mechanically compliant" includes a flexible mechanism that transfers an input force and displacement at one area, side, point, port, etc. to an output force and displacement at another area, side, point, port, etc. through elastic body deformation. In some examples, the system can provide relatively high local pressures at each contact point between the ground on the substrate and the ground coupling mechanism of the heat spreader for good electrical conductivity. At the same time, the total vertical force on the ground can remain low to prevent a significant reduction of the heat spreader force on the thermal interface material (TIM) and dies, which is required for good thermal contact and SoC performance. The total heat spreader force on the SoC package (e.g., dies plus ground) cannot be increased arbitrarily high due to structural integrity limits of the package/board solder joint connections. Fortunately, the force generated by each one or more ground coupling mechanisms between a ground on the substrate and a heat spreader can be controllable by virtue of the geometry of the ground coupling mechanism (e.g., width, length, incident angle, material, etc.).

More specifically, if the one or more ground coupling mechanisms between the ground on the substrate and at the heat spreader are a spring contacts, designing the spring tips to point down toward the ground or grounded stiffener with an angle and small contact area can increase the local contact pressure generated (e.g., Hertzian contact stress), which is beneficial for good electrical contact and effective shielding, while minimizing the total force generated on the SoC package. Increased shielding effectiveness may be achieved by virtue of the contact spacing (e.g., by increasing the total number of contact points around the package). Various ground coupling mechanisms to couple the heat spreader to the ground on the substrate and create the radiation shield can be manufactured using a variety of existing processes suitable for high-volume manufacturing (e.g., forming, stamping, punching, etc.) and can be instantiated in a variety of geometries (e.g., spring tips, bendable fingers, formed or protruding bumps, deformable tabs, sliding contacts, etc.).

In an example, the heat spreader can include bendable contact fingers that couple with the ground. In another example, the ground can include bendable contact figures and when a heat spreader is assembled over the SoC, the fingers are bent or collapsed and are electrically contacted with a sidewall of the heat spreader. In yet another example, the ground can include a grooved surface for the insertion of a conductive gasket. In another example, the ground can include a protruded stiffener to contain and make contact with a conductive gasket coupled to the heat spreader. In another example, a conformable metallic foil can be located between the heat spreader and the ground.

If a grounded package stiffener is present, the system can utilize the electrically-ground package stiffener and heat spreader and therefore does not require any PCB ground contacts. In one instantiation, the ground coupling mechanism is implemented on the heat spreader. This can consist of spring tips, bendable fingers, formed or protruding bumps, deformable tabs, sliding contacts, etc. In other instantiations, the ground coupling mechanism is implemented on the grounded package stiffener. This can likewise consist of spring tips, bendable fingers, formed or protruding bumps, deformable tabs, sliding contacts, etc. In other instantiations, the ground coupling mechanism can include features implemented on both the heat spreader and the grounded package stiffener. In other instantiations, the ground coupling mechanism may be created using a conductive paste, epoxy, or gasket, applied at the time of system assembly or in advance using any number of techniques to print, adhere, dispense, or otherwise apply the conductive gasket to the heat spreader and/or the grounded package stiffener. Such instantiations may also make use of a grooved or an otherwise formed/altered surface for containing the conductive gasket/paste.

Turning to the infrastructure of FIG. 1, network 118 represents a series of points or nodes of interconnected communication paths for receiving and transmitting packets of information. Network 118 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 118, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic devices 102a-102d are meant to encompass a computer, a personal digital assistant (PDA), a laptop or electronic notebook, a cellular telephone, an iPhone, an IP phone, network elements, network appliances, servers, routers, switches, gateways, bridges, load balancers, processors, modules, or any other device, component, element, or object that includes a radiation source and/or a radiation sensitive device. Each of electronic devices 102a-120d may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102a-120d may include virtual elements.

In regards to the internal structure, each of electronic devices 102a-120d can include memory elements for storing information to be used in operations. Each of electronic devices 102a-120d may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations. This includes the memory elements being able to store software, logic, code, or processor instructions that are executed to carry out operations or activities.

Additionally, each of electronic devices 102a-102d can include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2A:
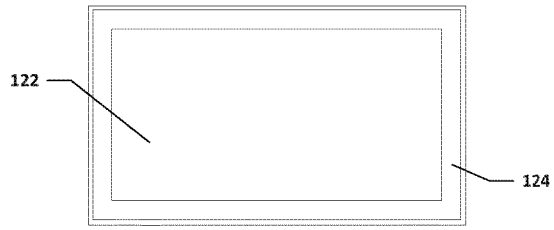
FIG. 2A is a simplified block diagram of a partial view of a system to enable a radiation shield around a component on a substrate, in accordance with an embodiment of the present disclosure.

Turning to FIG. 2A, FIG. 2A is a simplified block diagram of a heat spreader 122. Heat spreader 122 can include a ground coupling mechanism 124. In an example, heat spreader 122 can be over a radiation source (e.g., radiation source 110) or a radiation sensitive device (e.g., radiation sensitive device 112) and ground coupling mechanism 124 can couple with a ground on a substrate to create a radiation shield for the radiation source or the radiation sensitive device.

Figure 2B:
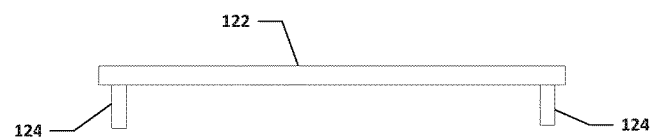
FIG. 2B is a simplified block diagram of a partial view of a system to enable a radiation shield around a component on a substrate, in accordance with an embodiment of the present disclosure.

Turning to FIG. 2B, FIG. 2B is a simplified block diagram of a side view of heat spreader 122. Heat spreader 122 can include ground coupling mechanism 124. In an example, heat spreader 122 can be over a radiation source (e.g., radiation source 110) or a radiation sensitive device (e.g., radiation sensitive device 112) and ground coupling mechanism 124 can couple with a ground on a substrate to create a radiation shield for the radiation source or the radiation sensitive device.

Figure 2C:
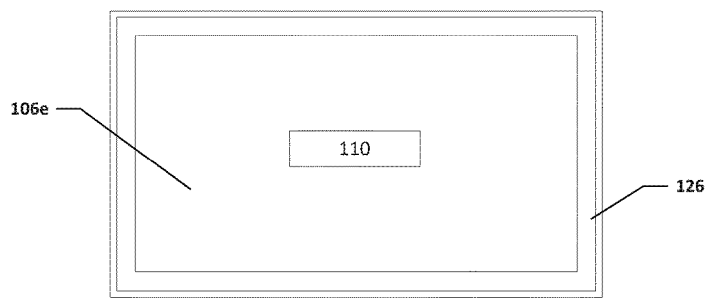
FIG. 2C is a simplified block diagram of a partial view of a system to enable a radiation shield around a component on a substrate, in accordance with an embodiment of the present disclosure.

Turning to FIG. 2C, FIG. 2C is a simplified block diagram of a substrate 106e. Substrate 106e can include radiation source 110 and ground 126. In an example, ground 126 can be a stiffener. Ground 126 may be created or grounded by connecting ground 126 to traces, vias, layers, etc. internal to substrate 106e and/or through intermediate traces, vias, layers, etc., and through a ball grid array connections or other surface-mount packaging connections to grounded traces, planes, layers, etc. in the system board.

Figure 2D:
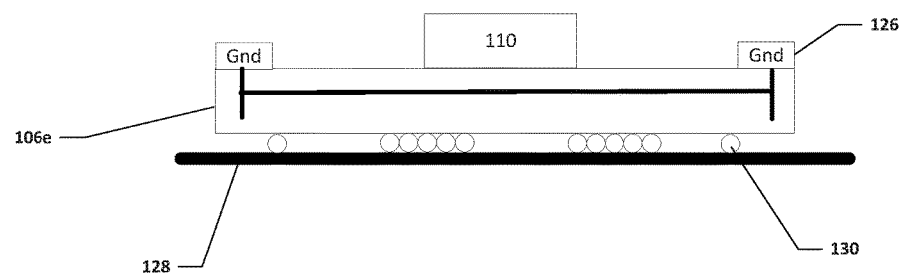
FIG. 2D is a simplified block diagram of a partial view of a system to enable a radiation shield around a component on a substrate, in accordance with an embodiment of the present disclosure.

Turning to FIG. 2D, FIG. 2D is a simplified block diagram of a side view of substrate 106e. Substrate 106e can include radiation source 110 and ground 126. Substrate 106e can be coupled to a printed circuit board (PCB) 128 using solder balls 130. In an example, ground 126 on substrate 106e can couple with ground coupling mechanism 124 on heat spreader 122 to create a radiation shield for radiation source 110. Ground coupling mechanism 124 can be electrically conductive and mechanically compliant. The term "mechanically compliant" includes a flexible mechanism that transfers an input force (e.g., a downward force from heat spreader 122) and displacement at one area, side, point, port, etc. to an output force (e.g., a downward force on ground 126) and displacement at another area, side, point, port, etc. through elastic body deformation.

Figure 2E:
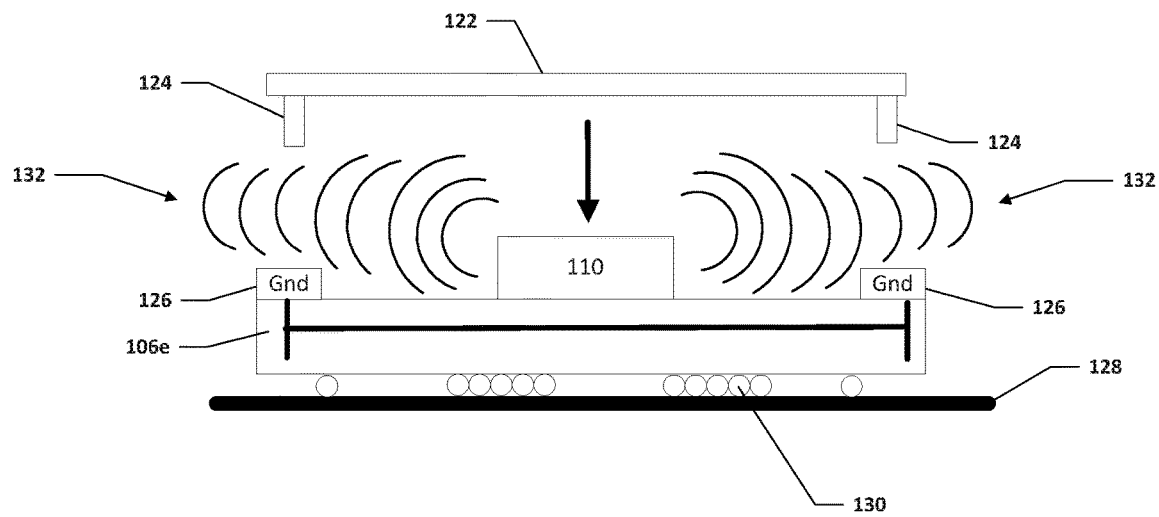
FIG. 2E is a simplified block diagram of a partial view of a system to enable a radiation shield around a component on a substrate, in accordance with an embodiment of the present disclosure.

Turning to FIG. 2E, FIG. 2E is a simplified block diagram of heat spreader 122 being coupled with substrate 106e. Heat spreader 122 can include ground coupling mechanism 124. Substrate 106e can include radiation source 110 and ground 126. Substrate 106e can be coupled to PCB 128 using solder balls 130. As illustrated in FIG. 2E, radiation source 110 can be emitting radiation 132 past the boundaries of substrate 106. Heat spreader 122 can be positioned over radiation source 110 to allow ground coupling mechanism 124 to couple with ground 126 on substrate 106e.

Figure 2F:
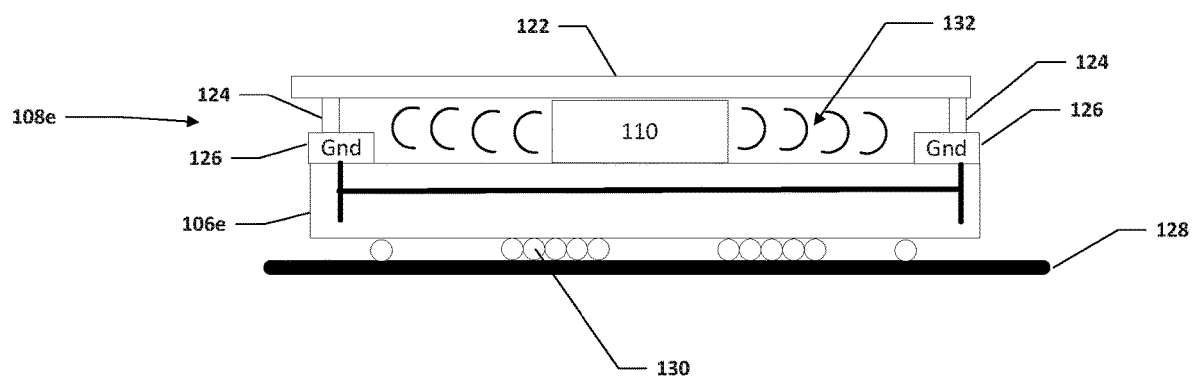
FIG. 2F is a simplified block diagram of a system to enable a radiation shield around a component on a substrate, in accordance with an embodiment of the present disclosure.

Turning to FIG. 2F, FIG. 2F is a simplified block diagram of heat spreader 122 coupled with substrate 106e to create a radiation shield 108e. Heat spreader 122 can be over radiation source 110 and transfer heat away from radiation source 110. Heat spreader 122 can include ground coupling mechanism 124. Substrate 106e can include radiation source 110 and ground 126. Substrate 106e can be coupled to PCB 128 using solder balls 130. Ground coupling mechanism 124 can couple with ground 126 on substrate 106e to create radiation shield 108e. Radiation shield 108e can help to block radiation 132 from radiation source 110 from emitting past the boundaries of substrate 106e.

Figure 3:
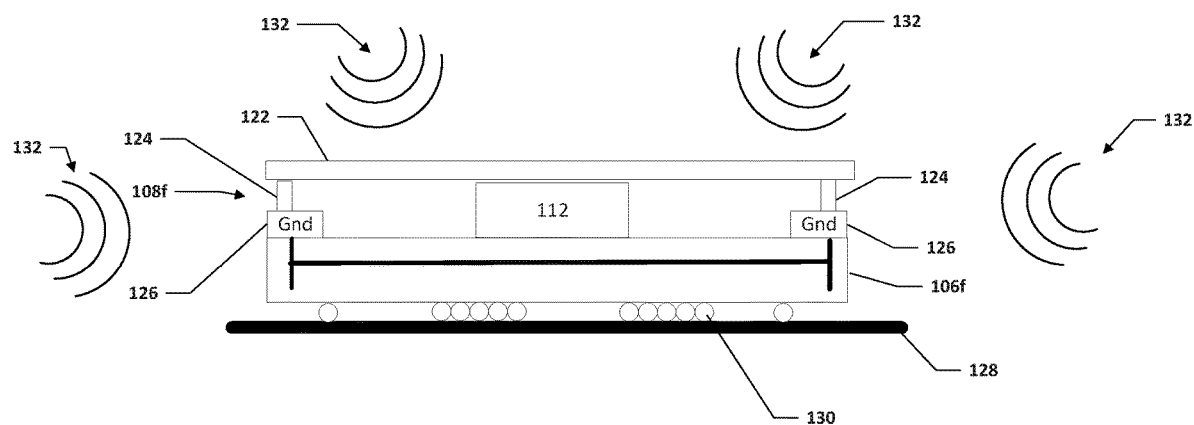
FIG. 3 is a simplified block diagram of a system to enable a radiation shield around a component on a substrate, in accordance with an embodiment of the present disclosure.

Turning to FIG. 3, FIG. 3 is a simplified block diagram of heat spreader 122 coupled with substrate a 106f to create a radiation shield 108f. Heat spreader 122 can include ground coupling mechanism 124. Substrate 106f can include radiation sensitive device 112 and ground 126. Substrate 106f can be coupled to PCB 128 using solder balls 130. Ground coupling mechanism 124 can couple with ground 126 on substrate 106f to create radiation shield 108f. Radiation shield 108f can help to block radiation 132 from reaching radiation sensitive device 112. Heat spreader 122 can be over radiation sensitive device 112 and transfer heat away from radiation sensitive device 112.

Figure 4:
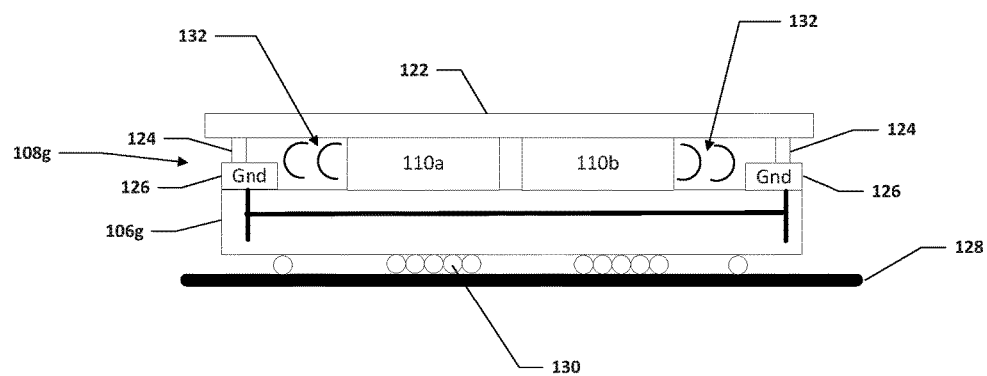
FIG. 4 is a simplified block diagram of a system to enable a radiation shield around a component on a substrate, in accordance with an embodiment of the present disclosure.

Turning to FIG. 4, FIG. 4 is a simplified block diagram of heat spreader 122 coupled with a substrate 106g to create a radiation shield 108g. Heat spreader 122 can include ground coupling mechanism 124. Substrate 106g can include a first radiation source 110a, a second radiation source 110b, and ground 126. Substrate 106g can be coupled to PCB 128 using solder balls 130. Ground coupling mechanism 124 can couple with ground 126 on substrate 106g to create radiation shield 108g. Radiation shield 108g can help to block radiation 132 from radiation sources 110a and 110b from emitting past the boundaries of substrate 106g. Heat spreader 122 can be over first radiation source 110a and second radiation source 110b and transfer heat away from first radiation source 110a and second radiation source 110b.

Figure 5:
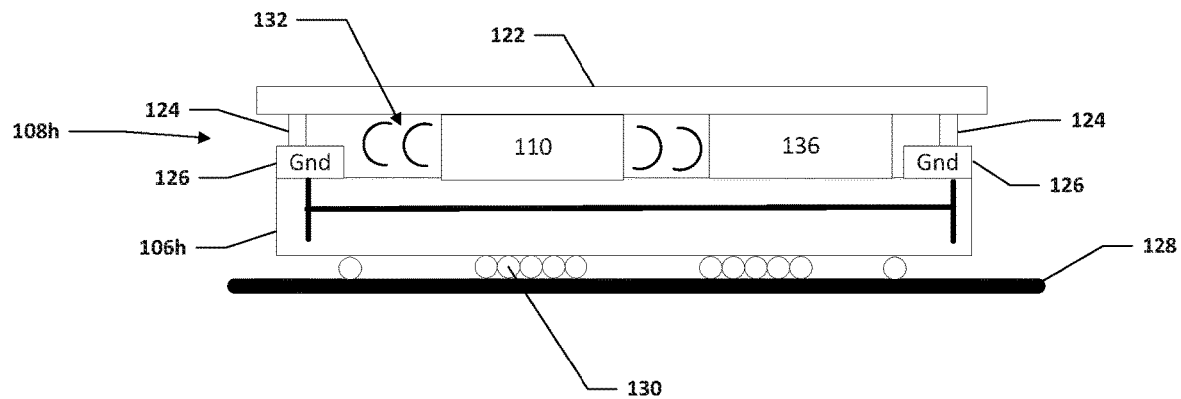
FIG. 5 is a simplified block diagram of a system to enable a radiation shield around a component on a substrate, in accordance with an embodiment of the present disclosure.

Turning to FIG. 5, FIG. 5 is a simplified block diagram of heat spreader 122 coupled with a substrate 106h to create a radiation shield 108h. Heat spreader 122 can include ground coupling mechanism 124. Substrate 106h can include radiation source 110, ground 126, and an electronic component 136. Electronic component 136 may be an electronic device or element that is not susceptible to radiation 132 from radiation source 110. Substrate 106h can be coupled to PCB 128 using solder balls 130. Ground coupling mechanism 124 can couple with ground 126 on substrate 106h to create radiation shield 108h. Radiation shield 108h can help to block radiation 132 from radiation source 110 from emitting past the boundaries of substrate 106h. Heat spreader 122 can be over radiation source 110 and electronic component 136 and transfer heat away from radiation source 110 and electronic component 136.

Figure 6:
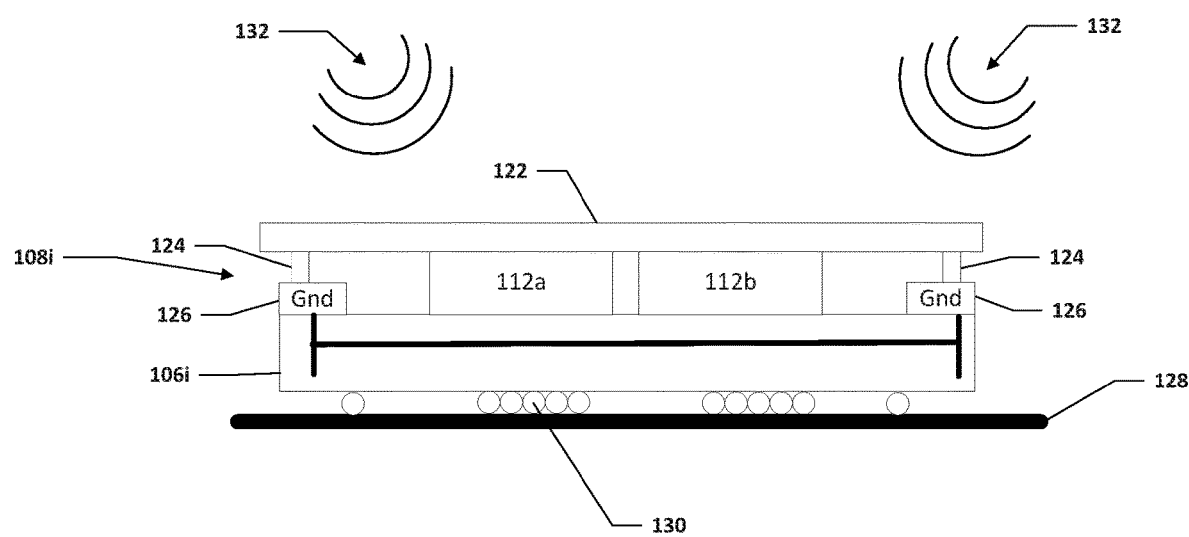
FIG. 6 is a simplified block diagram of a system to enable a radiation shield around a component on a substrate, in accordance with an embodiment of the present disclosure.

Turning to FIG. 6, FIG. 6 is a simplified block diagram of heat spreader 122 coupled with a substrate 106i to create a radiation shield 108i. Heat spreader 122 can include ground coupling mechanism 124. Substrate 106 can include a first radiation sensitive device 112a, a second radiation sensitive device 112b, and ground 126. Substrate 106i can be coupled to PCB 128 using solder balls 130. Ground coupling mechanism 124 can couple with ground 126 on substrate 106i to create radiation shield 108i. Radiation shield 108i can help to prevent radiation 132 from reaching first radiation sensitive device 112a and second radiation sensitive device 112b. Heat spreader 122 can be over first radiation sensitive device 112a and second radiation sensitive device 112b and transfer heat away from first radiation sensitive device 112a and second radiation sensitive device 112b.

Figure 7:
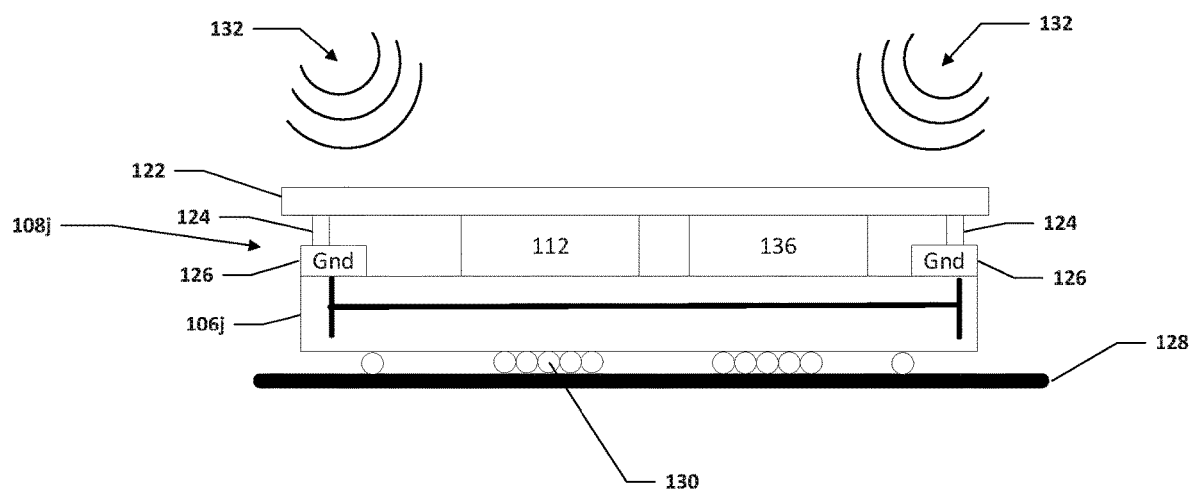
FIG. 7 is a simplified block diagram of a system to enable a radiation shield around a component on a substrate, in accordance with an embodiment of the present disclosure.

Turning to FIG. 7, FIG. 7 is a simplified block diagram of heat spreader 122 coupled with a substrate 106j to create a radiation shield 108j. Heat spreader 122 can include ground coupling mechanism 124. Substrate 106j can include radiation sensitive device 112, ground 126, and an electronic component 136. Substrate 106j can be coupled to PCB 128 using solder balls 130. Ground coupling mechanism 124 can couple with ground 126 on substrate 106j to create radiation shield 108j. Radiation shield 108j can help to prevent radiation 132 from reaching radiation sensitive device 112. Heat spreader 122 can be over radiation sensitive device 112 and electronic component 136 and transfer heat away from radiation sensitive device 112 and electronic component 136.

Figure 8A:
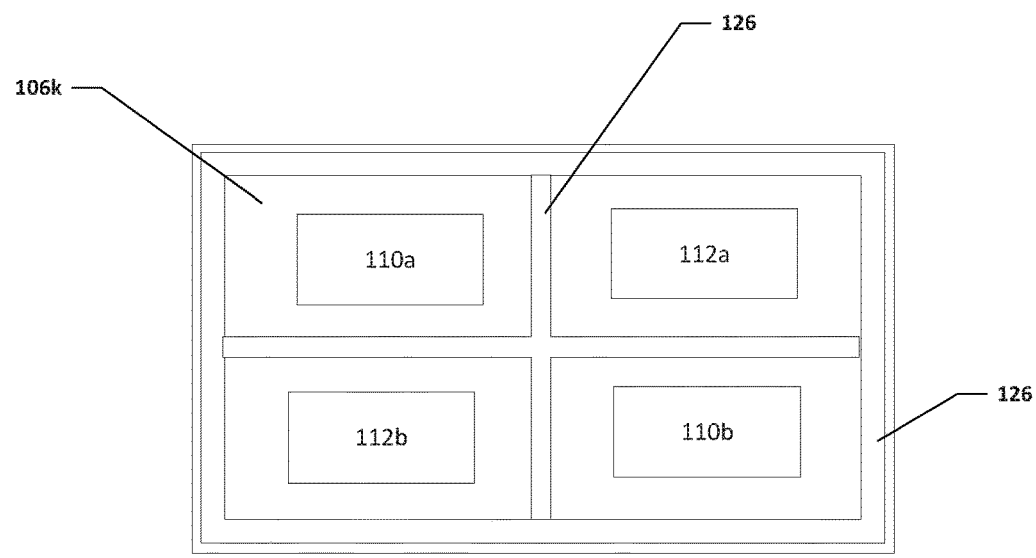
FIG. 8A is a simplified block diagram of a partial view of a system to enable a radiation shield around a component on a substrate, in accordance with an embodiment of the present disclosure.

Turning to FIG. 8A, FIG. 8A is a simplified block diagram of a substrate 106k. Substrate 106k can include a plurality of radiation sources 110a and 110b, a plurality of radiation sensitive devices 112a and 112b, and ground 126. Ground 126 can extend around one or more of radiation sources 110a and 110b and one or more radiation sensitive devices 112a and 112b.

Figure 8B:
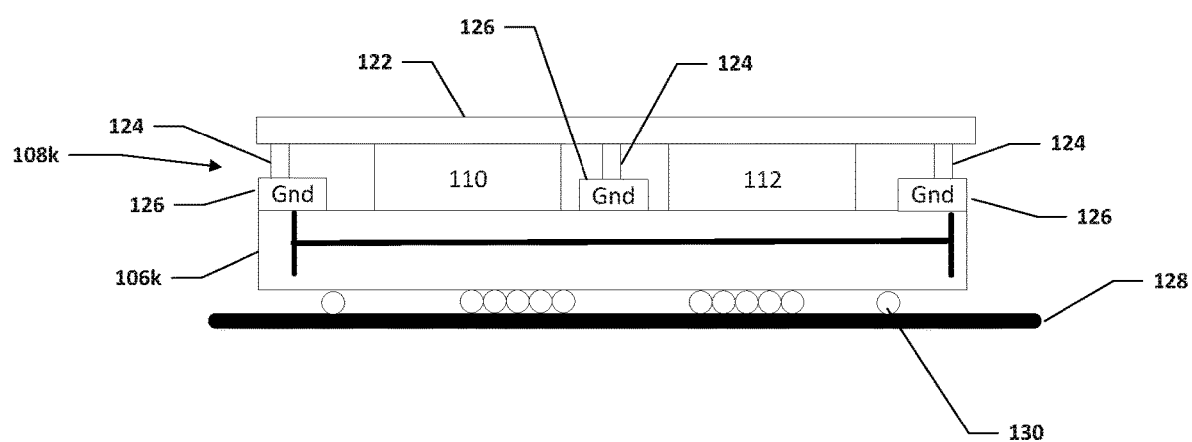
FIG. 8B is a simplified block diagram of a system to enable a radiation shield around a component on a substrate, in accordance with an embodiment of the present disclosure.

Turning to FIG. 8B, FIG. 8B is a simplified block diagram of heat spreader 122 coupled with substrate 106k to create a radiation shield 108m. Substrate 106k can include plurality of radiation sources 110a and 110b, plurality of radiation sensitive devices 112a and 112b, and ground 126. Substrate 106k can be coupled to PCB 128 using solder balls 130. As illustrated in FIG. 8B, ground coupling mechanism 124 on heat spreader 122 can be coupled with ground 126 on substrate 106k to create radiation shield 108k. Radiation shield 108m can help to block radiation 132 from radiation sources 110a and 110b from emitting past the boundaries of substrate 106k as well as from reaching radiation sensitive devices 112a and 112b. Heat spreader 122 can be over radiation sources 110a and 110b and radiation sensitive devices 112a and 112b and transfer heat away from radiation sources 110a and 110b and radiation sensitive devices 112a and 112b.

Figure 9A:
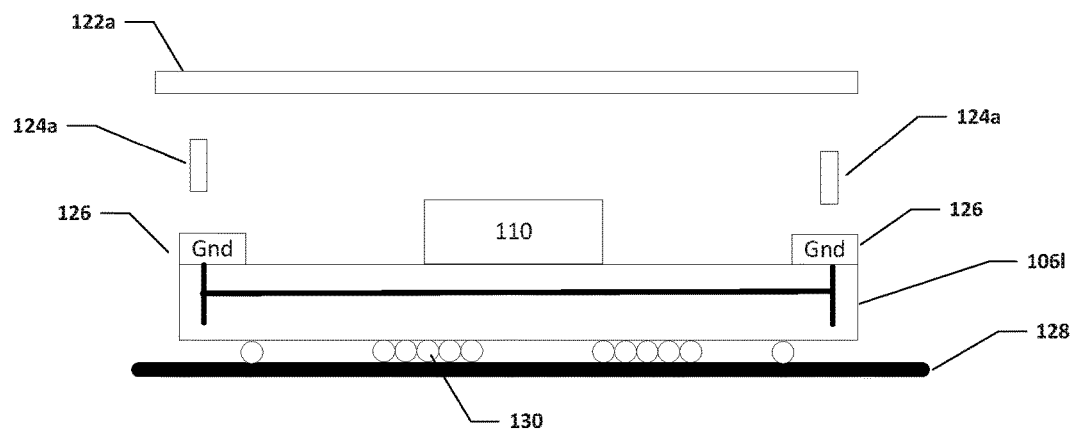
FIG. 9A is a simplified block diagram of a partial view of a system to enable a radiation shield around a component on a substrate, in accordance with an embodiment of the present disclosure.

Turning to FIG. 9A, FIG. 9A is a simplified block diagram of heat spreader 122a being coupled with a substrate 106l. Ground coupling mechanism 124a can be separate from heat spreader 122a. Substrate 106l can include radiation source 110 and ground 126. Substrate 106l can be coupled to PCB 128 using solder balls 130.

Figure 9B:
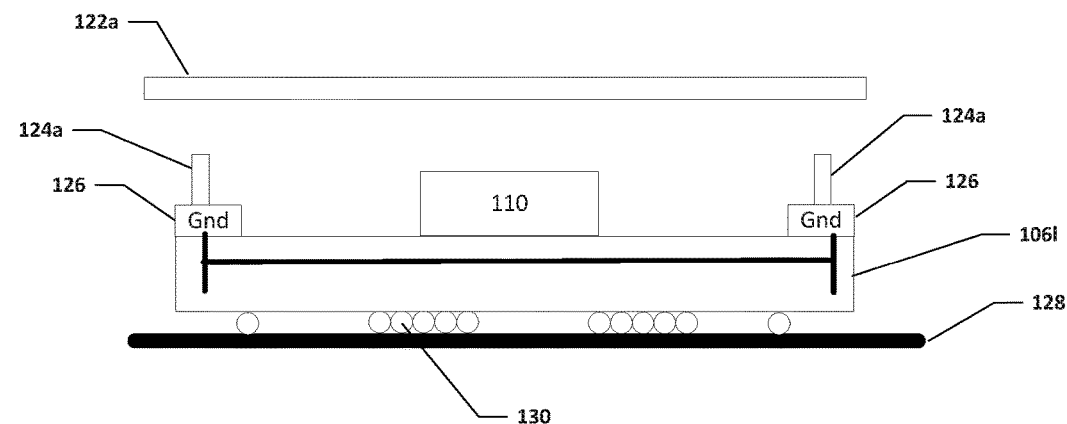
FIG. 9B is a simplified block diagram of a partial view of a system to enable a radiation shield around a component on a substrate, in accordance with an embodiment of the present disclosure.

Turning to FIG. 9B, FIG. 9B is a simplified block diagram of ground coupling mechanism 124a being coupled with substrate 106l. Substrate 106l can include radiation source 110 and ground 126. Substrate 106l can be coupled to PCB 128 using solder balls 130. As illustrated in FIG. 9B, ground coupling mechanism 124a can couple with ground 126 on substrate 106l.

Figure 9C:
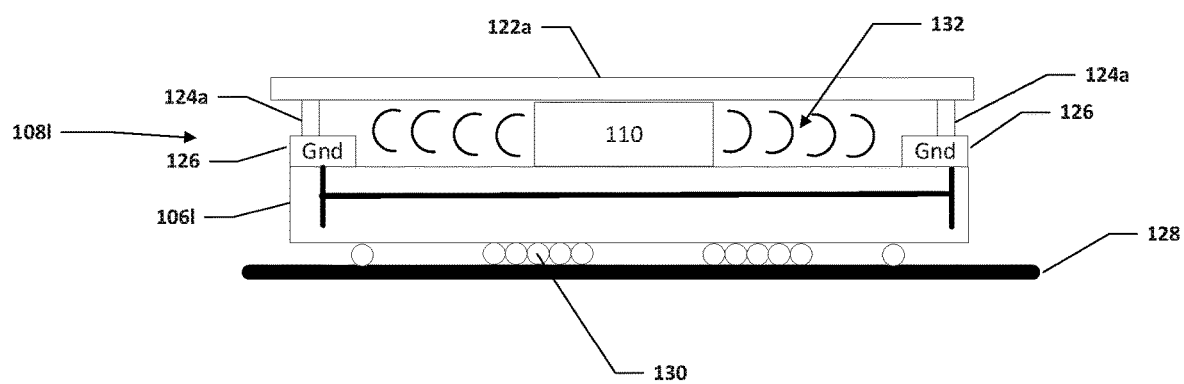
FIG. 9C is a simplified block diagram of a system to enable a radiation shield around a component on a substrate, in accordance with an embodiment of the present disclosure.

Turning to FIG. 9C, FIG. 9C is a simplified block diagram of heat spreader 122a coupled with ground coupling mechanism 124a on substrate 106l to create a radiation shield 108l. Substrate 106l can include radiation source 110 and ground 126. Substrate 106l can be coupled to PCB 128 using solder balls 130. As illustrated in FIG. 9C, after ground coupling mechanism 124a is coupled with ground 126 on substrate 106l, heat spreader 122a can be coupled to ground coupling mechanism 124a to create radiation shield 108l. Radiation shield 108l can help to block radiation 132 from radiation source 110 from emitting past the boundaries of substrate 106l.

Figure 10:
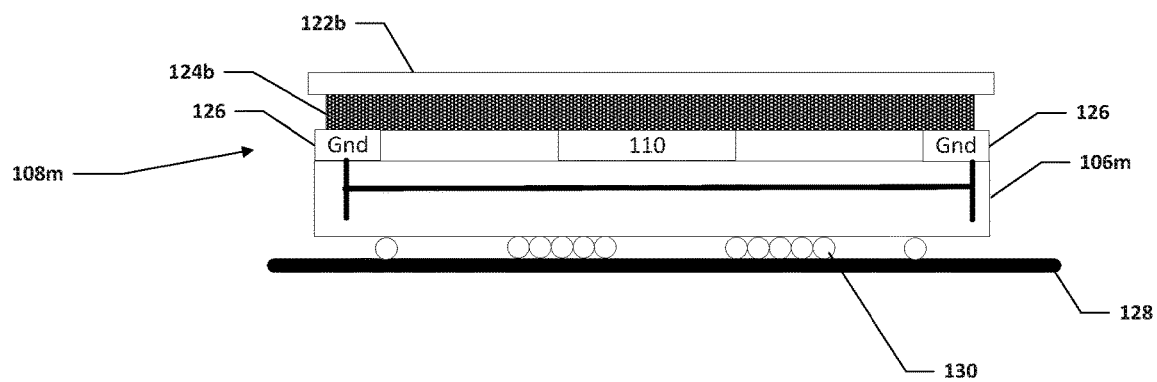
FIG. 10 is a simplified block diagram of a system to enable a radiation shield around a component on a substrate, in accordance with an embodiment of the present disclosure.

Turning to FIG. 10, FIG. 10 is a simplified block diagram of heat spreader 122b coupled with a substrate 106m to create a radiation shield 108m. Substrate 106m can include radiation source 110 and ground 126. Substrate 106m can be coupled to PCB 128 using solder balls 130. Heat spreader 122b can be over radiation source 110 with a ground coupling mechanism 124b between heat spreader 122b and radiation source 110. Ground coupling mechanisms 124b may be a conductive TIM, foil, conductive adhesive, or some other material that can help to transfer heat away from radiation source 110 and couple with ground 126 on substrate 106m to create radiation shield 108m. Radiation shield 108m can help to block radiation 132 from radiation source 110 from emitting past the boundaries of substrate 106m.

Figure 11A:
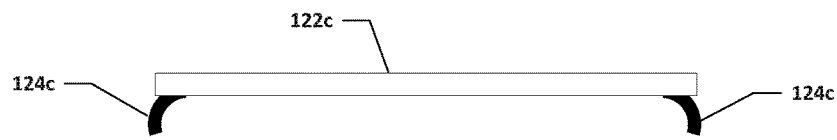
FIG. 11A is a simplified block diagram of a partial view of a system to enable a radiation shield around a component on a substrate, in accordance with an embodiment of the present disclosure.

Turning to FIG. 11A, FIG. 11A is a simplified block diagram of a side view of a heat spreader 122c. Heat spreader 122c can include a ground coupling mechanism 124c. Ground coupling mechanism 124c may be spring tips or some other flexible ground coupling mechanism that can couple with a ground on a substrate. In an example, heat spreader 122c can be over a radiation source (e.g., radiation source 110) or a radiation sensitive device (e.g., radiation sensitive device 112) and ground coupling mechanism 124c can couple with a ground on a substrate to create a radiation shield for the radiation source or the radiation sensitive device.

Figure 11B:
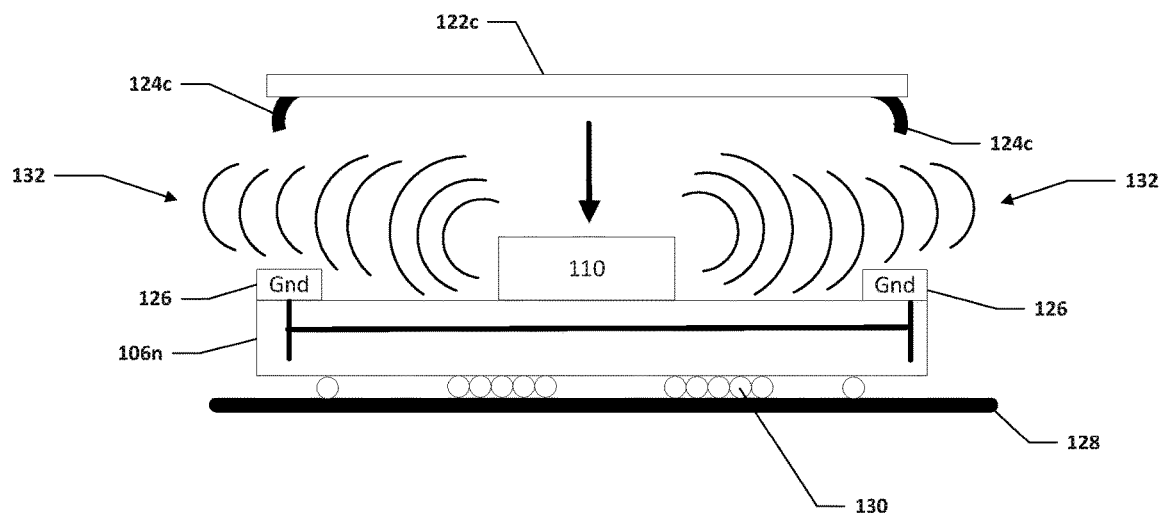
FIG. 11B is a simplified block diagram of a partial view of a system to enable a radiation shield around a component on a substrate, in accordance with an embodiment of the present disclosure.

Turning to FIG. 11B, FIG. 11B is a simplified block diagram of a side view of heat spreader 122c being coupled with substrate 106n. Heat spreader 122c can include ground coupling mechanism 124c. Substrate 106n can include radiation source 110 and ground 126. Substrate 106n can be coupled to PCB 128 using solder balls 130. As illustrated in FIG. 11B, radiation source 110 can be emitting radiation 132 past the boundaries of substrate 106n. Heat spreader 122c can be positioned over radiation source 110 to allow ground coupling mechanism 124c to couple with ground 126 on substrate 106n.

Figure 11C:
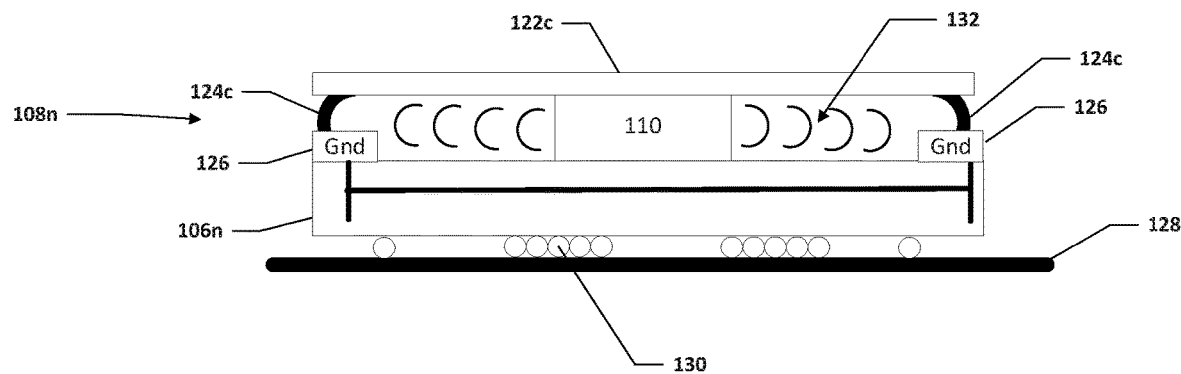
FIG. 11C is a simplified block diagram of a system to enable a radiation shield around a component on a substrate, in accordance with an embodiment of the present disclosure.

Turning to FIG. 11C, FIG. 11C is a simplified block diagram of heat spreader 122c coupled with substrate 106n to create a radiation shield 108n. Heat spreader 122c can include ground coupling mechanism 124c. Substrate 106n can include radiation source 110 and ground 126. Substrate 106n can be coupled to PCB 128 using solder balls 130. Ground coupling mechanism 124c can couple with ground 126 on substrate 106n to create radiation shield 108n. Radiation shield 108n can help to block radiation 132 from radiation source 110 from emitting past the boundaries of substrate 106n. Ground coupling mechanism 124c can be electrically conductive and mechanically compliant. The term "mechanically compliant" includes a flexible mechanism that transfers an input force (e.g., a downward force from heat spreader 122c) and displacement at one area, side, point, port, etc. to an output force (e.g., a downward force on ground 126) and displacement at another area, side, point, port, etc. through elastic body deformation.

Figure 12A:
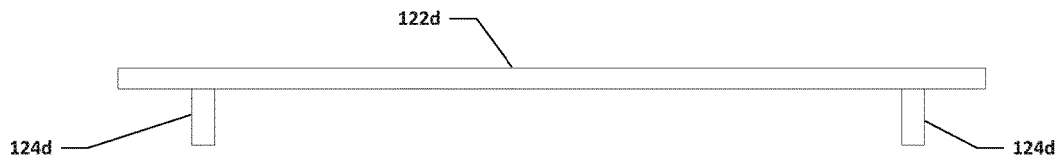
FIG. 12A is a simplified block diagram of a partial view of a system to enable a radiation shield around a component on a substrate, in accordance with an embodiment of the present disclosure.

Turning to FIG. 12A, FIG. 12A is a simplified block diagram of a side view of a heat spreader 122d. Heat spreader 122d can include a ground coupling mechanism 124d. In an example, heat spreader 122d can be over a radiation source (e.g., radiation source 110) or a radiation sensitive device (e.g., radiation sensitive device 112) and ground coupling mechanism 124d can couple with a ground on a substrate to create a radiation shield for the radiation source or the radiation sensitive device.

Figure 12B:
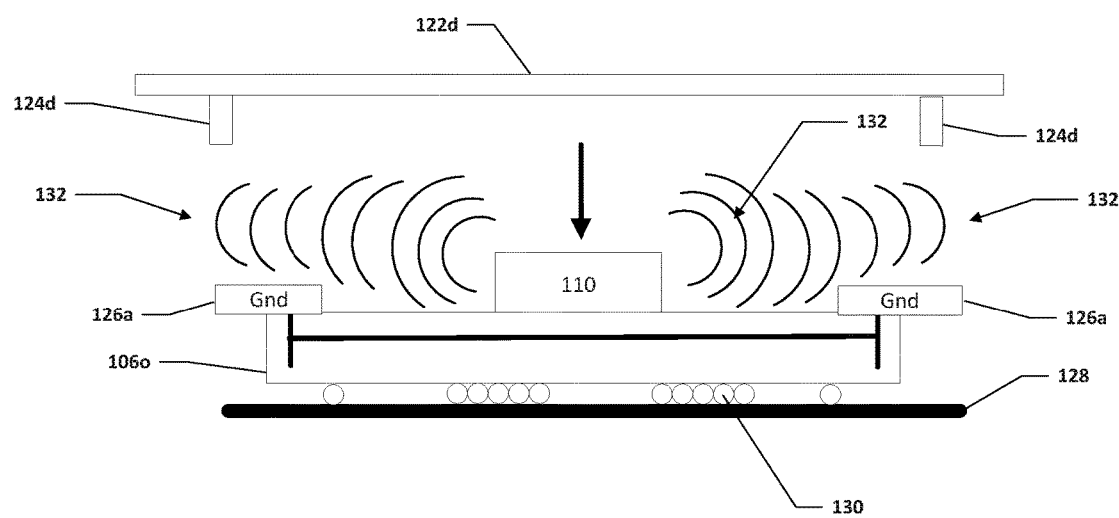
FIG. 12B is a simplified block diagram of a partial view of a system to enable a radiation shield around a component on a substrate, in accordance with an embodiment of the present disclosure.

Turning to FIG. 12B, FIG. 12B is a simplified block diagram of a side view of heat spreader 122d being coupled with substrate 106o. Heat spreader 122d can include ground coupling mechanism 124d. Substrate 106o can include radiation source 110 and a ground 126a. Ground 126a can extend past the sides of substrate 106o. In some examples, ground 126a may be flexible and can bend when pressure is applied to ground 126a. Substrate 106o can be coupled to PCB 128 using solder balls 130. As illustrated in FIG. 12B, radiation source 110 can be emitting radiation 132 past the boundaries of substrate 106o. Heat spreader 122d can be positioned over radiation source 110 to allow ground coupling mechanism 124d to couple with ground 126a on substrate 106o.

Figure 12C:
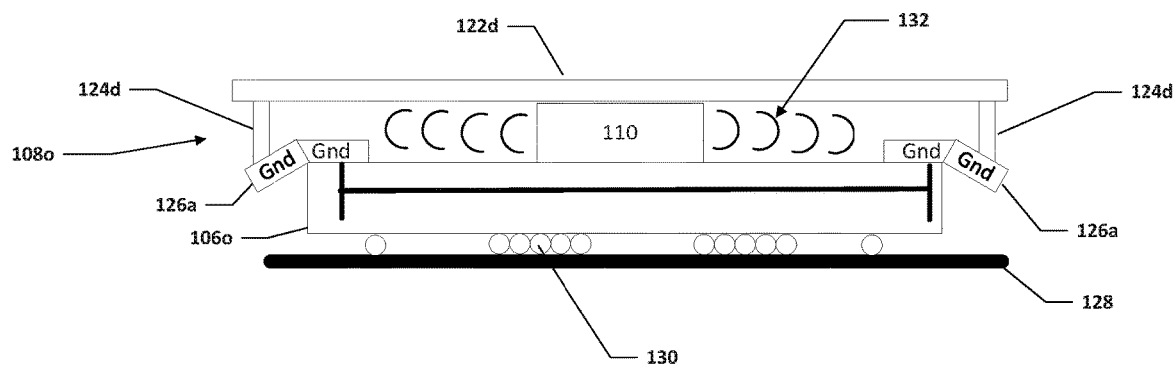
FIG. 12C is a simplified block diagram of a system to enable a radiation shield around a component on a substrate, in accordance with an embodiment of the present disclosure.

Turning to FIG. 12C, FIG. 12C is a simplified block diagram of heat spreader 122d coupled with substrate 106o to create a radiation shield 108o. Heat spreader 122d can include ground coupling mechanism 124d. Substrate 106o can include radiation source 110 and ground 126a. Substrate 106o can be coupled to PCB 128 using solder balls 130. Ground coupling mechanism 124d can couple with ground 126a on substrate 106o to create radiation shield 108o. In an example, when ground coupling mechanism 124d is coupled to ground 126a, pressure is applied to ground 126a and ground 126a becomes bent. Ground 126a can be flexible and resist the bending from ground coupling mechanism 124d such that the resistance from the force from ground coupling mechanism 124d can help to create good contact between ground coupling mechanism 124d on heat spreader 122d and ground 126a on substrate 106o to create radiation shield 108o. Radiation shield 108o can help to block radiation 132 from radiation source 110 from emitting past the boundaries of substrate 106o.

Figure 13A:
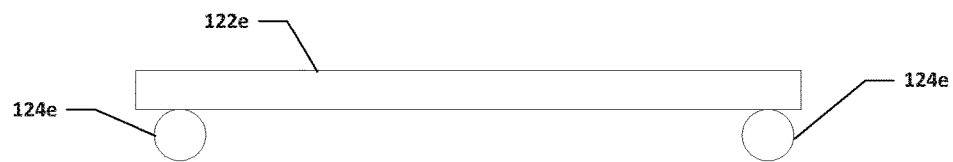
FIG. 13A is a simplified block diagram of a partial view of a system to enable a radiation shield around a component on a substrate, in accordance with an embodiment of the present disclosure.

Turning to FIG. 13A, FIG. 13A is a simplified block diagram of a side view of a heat spreader 122e. Heat spreader 122e can include a ground coupling mechanism 124e. Ground coupling mechanism 124e may be a conductive gasket, paste, or some other ground coupling mechanism that can couple with a ground on a substrate.

Figure 13B:
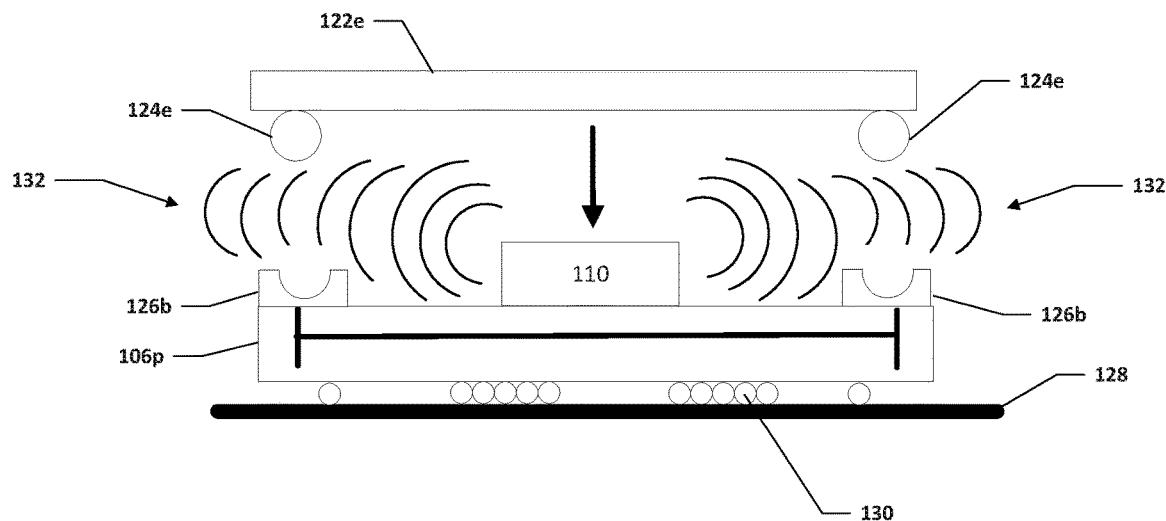
FIG. 13B is a simplified block diagram of a partial view of a system to enable a radiation shield around a component on a substrate, in accordance with an embodiment of the present disclosure.

Turning to FIG. 13B, FIG. 13B is a simplified block diagram of a side view of heat spreader 122e being coupled with substrate 106p. Heat spreader 122e can include ground coupling mechanism 124e. Substrate 106p can include radiation source 110 and a ground 126b. Ground 126b can have a groove, channel, or some other mating profile that can couple or mate with ground coupling mechanism 124e. Substrate 106p can be coupled to PCB 128 using solder balls 130. As illustrated in FIG. 13B, radiation source 110 can be emitting radiation 132 past the boundaries of substrate 106p. Heat spreader 122e can be positioned over radiation source 110 to allow ground coupling mechanism 124e to couple with ground 126b on substrate 106p.

Figure 13C:
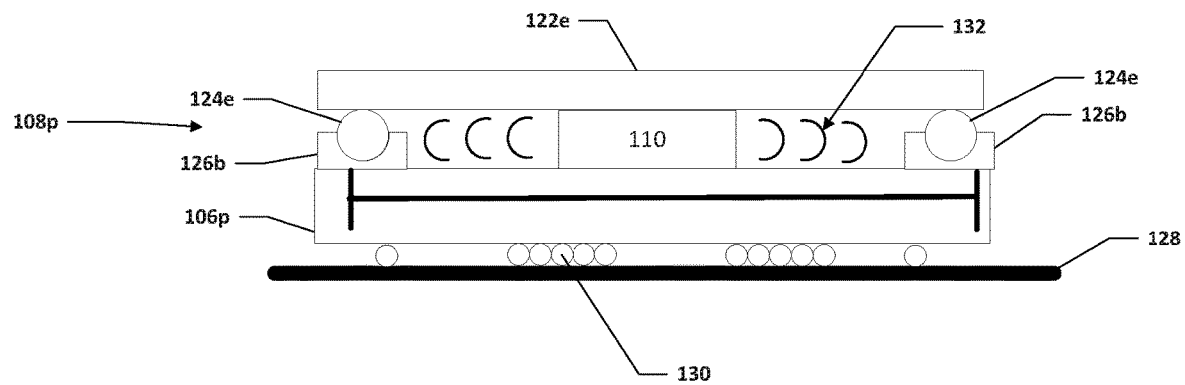
FIG. 13C is a simplified block diagram of a system to enable a radiation shield around a component on a substrate, in accordance with an embodiment of the present disclosure.

Turning to FIG. 13C, FIG. 13C is a simplified block diagram of heat spreader 122e coupled with substrate 106p to create a radiation shield 108p. Heat spreader 122e can include ground coupling mechanism 124e. Substrate 106p can include radiation source 110 and ground 126b. Substrate 106p can be coupled to PCB 128 using solder balls 130. Ground coupling mechanism 124e can couple with ground 126b on substrate 106p to create radiation shield 108p. Radiation shield 108p can help to block radiation 132 from radiation source 110 from emitting past the boundaries of substrate 106p. Ground coupling mechanism 124e can be electrically conductive and mechanically compliant. The term "mechanically compliant" includes a flexible mechanism that transfers an input force (e.g., a downward force from heat spreader 122e) and displacement at one area, side, point, port, etc. to an output force (e.g., a downward force on ground 126b) and displacement at another area, side, point, port, etc. through elastic body deformation.

Figure 14A:
FIG. 14A is a simplified block diagram of a partial view of a system to enable a radiation shield around a component on a substrate, in accordance with an embodiment of the present disclosure.

Turning to FIG. 14A, FIG. 14A is a simplified block diagram of a side view of a heat spreader 122f. Heat spreader 122f can include a ground coupling mechanism 124f. Ground coupling mechanism 124f may be a conductive gasket, paste, or some other ground coupling mechanism that can couple with a ground on a substrate.

Figure 14B:
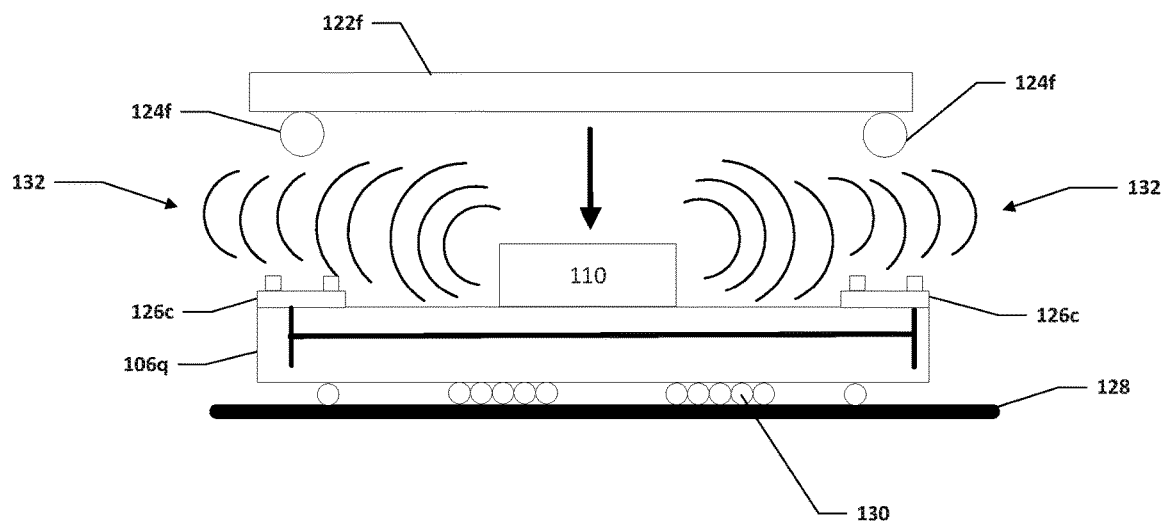
FIG. 14B is a simplified block diagram of a partial view of a system to enable a radiation shield around a component on a substrate, in accordance with an embodiment of the present disclosure.

Turning to FIG. 14B, FIG. 14B is a simplified block diagram of a side view of heat spreader 122f being coupled with substrate 106q. Heat spreader 122f can include ground coupling mechanism 124f. Substrate 106q can include radiation source 110 and a ground 126c. Ground 126c can have a groove, channel, or some other mating profile that can couple or mate with ground coupling mechanism 124f. Substrate 106q can be coupled to PCB 128 using solder balls 130. As illustrated in FIG. 14B, radiation source 110 can be emitting radiation 132 past the boundaries of substrate 106q. Heat spreader 122f can be positioned over radiation source 110 to allow ground coupling mechanism 124f to couple with ground 126c on substrate 106q.

Figure 14C:
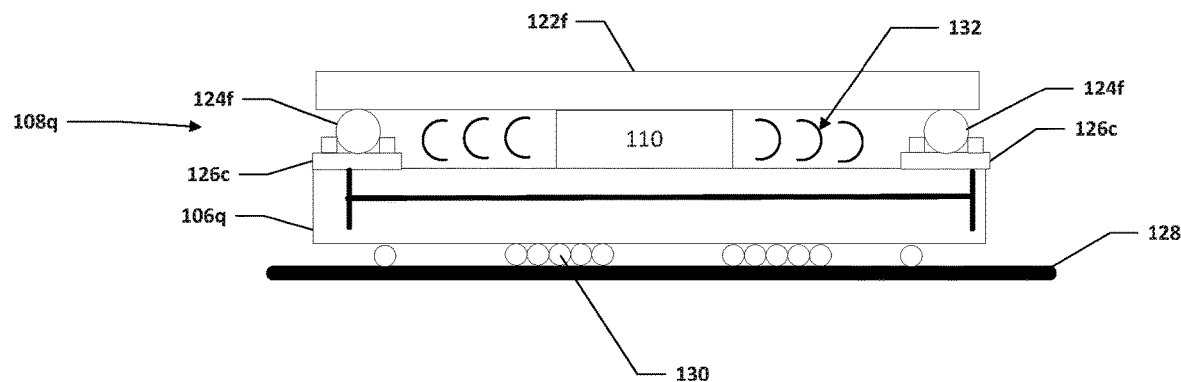
FIG. 14C is a simplified block diagram of a system to enable a radiation shield around a component on a substrate, in accordance with an embodiment of the present disclosure.

Turning to FIG. 14C, FIG. 14C is a simplified block diagram of heat spreader 122f coupled with substrate 106q to create a radiation shield 108q. Heat spreader 122f can include ground coupling mechanism 124f. Substrate 106q can include radiation source 110 and ground 126c. Substrate 106q can be coupled to PCB 128 using solder balls 130. Ground coupling mechanism 124f can couple with ground 126c on substrate 106q to create radiation shield 108q. Radiation shield 108q can help to block radiation 132 from radiation source 110 from emitting past the boundaries of substrate 106q. Ground coupling mechanism 124f can be electrically conductive and mechanically compliant. The term "mechanically compliant" includes a flexible mechanism that transfers an input force (e.g., a downward force from heat spreader 122f) and displacement at one area, side, point, port, etc. to an output force (e.g., a downward force on ground 126c) and displacement at another area, side, point, port, etc. through elastic body deformation.

Figure 15A:
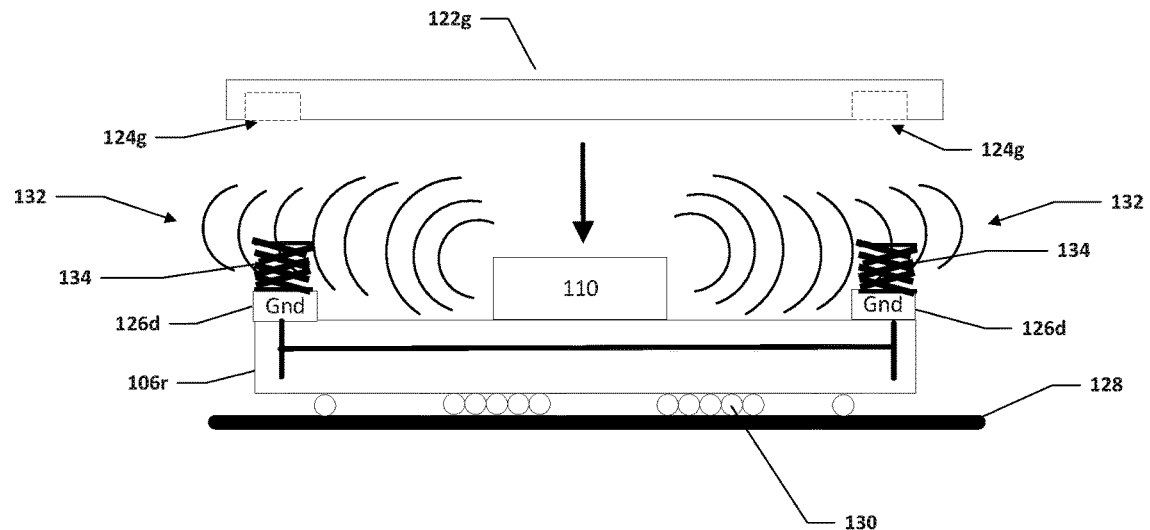
FIG. 15A is a simplified block diagram of a partial view of a system to enable a radiation shield around a component on a substrate, in accordance with an embodiment of the present disclosure.

Turning to FIG. 15A, FIG. 15A is a simplified block diagram of a side view of heat spreader 122g being coupled with substrate 106r. Heat spreader 122g can include a ground coupling mechanism 124g. As illustrated in FIG. 15A, ground coupling mechanism 124g can be a recessed slit or a groove formed into heat spreader 122g. Substrate 106r can include radiation source 110 and ground 126d. Ground 126d can include a spring 134, coupling sleeve, elastomer bumps, or some other mechanism that can dampen pressure from heat spreader 122g, and/or couple or mate with ground coupling mechanism 124g. Substrate 106r can be coupled to PCB 128 using solder balls 130. As illustrated in FIG. 15A, radiation source 110 can be emitting radiation 132 past the boundaries of substrate 106r. Heat spreader 122g can be positioned over radiation source 110 and spring 134 can be inserted into and through heat spreader 122g to allow ground coupling mechanism 124g to couple with ground 126d on substrate 106r.

Figure 15B:
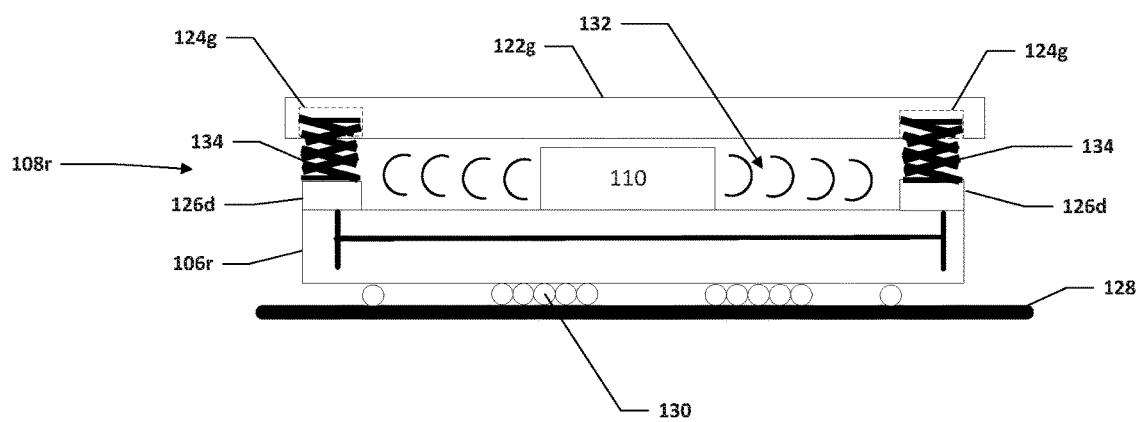
FIG. 15B is a simplified block diagram of a system to enable a radiation shield around a component on a substrate, in accordance with an embodiment of the present disclosure.

Turning to FIG. 15B, FIG. 15B is a simplified block diagram of heat spreader 122g coupled with substrate 106r to create a radiation shield 108r. Heat spreader 122g can include ground coupling mechanism 124g. Substrate 106r can include radiation source 110 and ground 126d. Substrate 106r can be coupled to PCB 128 using solder balls 130. Ground coupling mechanism 124g can couple with ground 126d on substrate 106r through spring 134 to create radiation shield 108r. Radiation shield 108r can help to block radiation 132 from radiation source 110 from emitting past the boundaries of substrate 106r.

Figure 16:
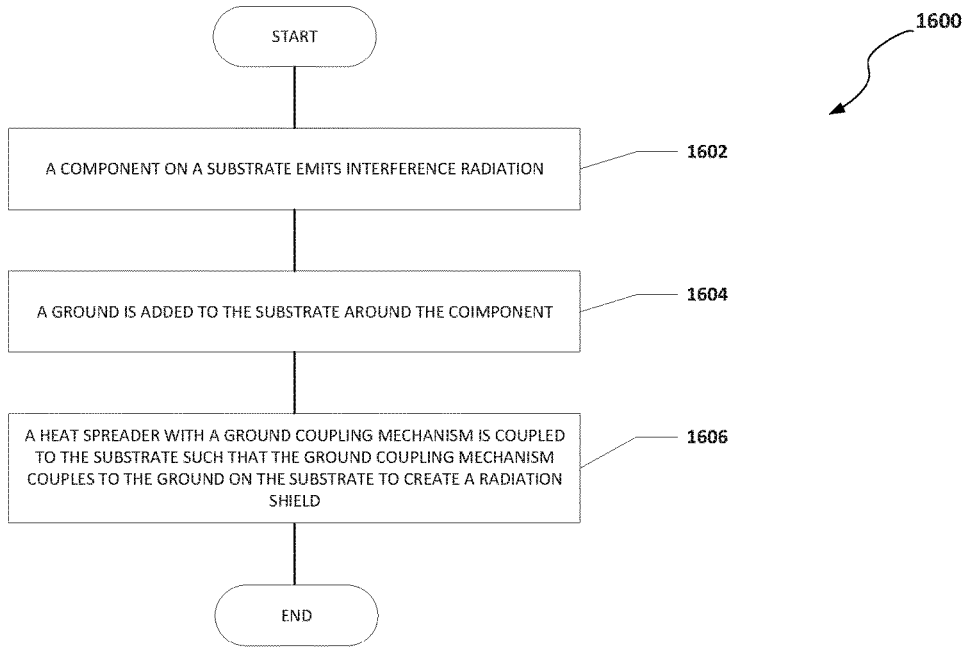
FIG. 16 is a simplified flowchart illustrating potential operations that may be associated with the system in accordance with an embodiment.

Turning to FIG. 16, FIG. 16 is an example flowchart illustrating possible operations of a flow 1600 that may be associated with enabling a radiation shield around a component on a substrate, in accordance with an embodiment. At 1602, a component on a substrate emits interference radiation. At 1604, a ground is added to the substrate around the component that emits interference radiation. In an example, to create the ground, the ground is connected to traces, vias, layers, etc. internal to the package and/or through intermediate traces, vias, layers, etc., and through one or more ball grid array connections or other surface-mount packaging connections to grounded traces, planes, layers, etc. in the system board. At 1606, a heat spreader with a ground coupling mechanism is coupled to the substrate such that the ground coupling mechanism couples to the ground on the substrate to create a radiation shield around the component on the substrate that emits interference radiation.

Figure 17:
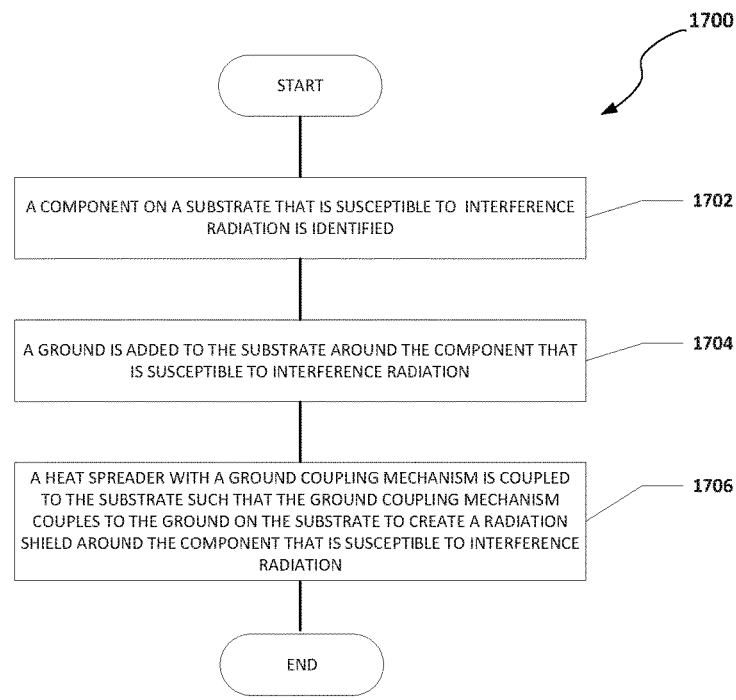
FIG. 17 is a simplified flowchart illustrating potential operations that may be associated with the system in accordance with an embodiment.

Turning to FIG. 17, FIG. 17 is an example flowchart illustrating possible operations of a flow 1700 that may be associated with enabling a radiation shield around a component on a substrate, in accordance with an embodiment. At 1702, a component on a substrate that is susceptible to interference radiation is identified. At 1704, a ground is added to the substrate around the component that is susceptible to interference radiation. In an example, to create the ground, the ground is connected to traces, vias, layers, etc. internal to the package and/or through intermediate traces, vias, layers, etc., and through one or more ball grid array connections or other surface-mount packaging connections to grounded traces, planes, layers, etc. in the system board. At 1706, a heat spreader with a ground coupling mechanism is coupled to the substrate such that the ground coupling mechanism couples to the ground on the substrate to create a radiation shield around the component on the substrate that is susceptible to interference radiation.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic devices 102a-102d has been illustrated with reference to particular elements and operations, these elements and operations may be replaced by any suitable architecture, protocols, and/or processes that achieve the intended functionality of electronic devices 102a-102d.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, an electronic device can include a substrate, a radiation source on the substrate, a ground on the substrate, where the ground is located around the radiation source, and a heat spreader over the radiation source, where the heat spreader includes one or more ground coupling mechanisms that are in contact with the ground on the substrate.

In Example A2, the subject matter of Example A1 can optionally include where the one or more ground coupling mechanisms in contact with the ground on the substrate create a radiation shield that at least partially keeps radiation from the radiation source from extending past the substrate.

In Example A3, the subject matter of any one of Examples A1-A2 can optionally include where the one or more ground coupling mechanisms that are in contact with the ground on the substrate create a Faraday cage around the radiation source.

In Example A4, the subject matter of any one of Examples A1-A3 can optionally include where the ground is part of a stiffener for the substrate.

In Example A5, the subject matter of any one of Examples A1-A4 can optionally include where the radiation source emits electromagnetic interference and/or radio-frequency interference.

In Example A6, the subject matter of any one of Examples A1-A5 can optionally include where the one or more ground coupling mechanisms are electrically conductive and mechanically compliant.

In Example A7, the subject matter of any one of Examples A1-A6 can optionally include where the radiation source is part of a system on a chip package.

Example AA1 is an electronic device including a substrate, a radiation sensitive device on the substrate, a ground on the substrate, where the ground is located around the radiation sensitive device, and a heat spreader over the radiation sensitive device, where the heat spreader includes one or more ground coupling mechanisms that are in contact with the ground on the substrate.

In Example AA2, the subject matter of Example AA1 can optionally include where the one or more ground coupling mechanisms in contact with the ground on the substrate create a radiation shield that at least partially keeps radiation from a radiation source from the radiation sensitive device.

In Example AA3, the subject matter of any one of Examples AA1-AA2 can optionally include where the one or more ground coupling mechanisms that are in contact with the ground on the substrate create a Faraday cage around the radiation sensitive device.

In Example AA4, the subject matter of any one of Examples AA1-AA3 can optionally include where the ground is part of a stiffener for the substrate.

In Example AA5, the subject matter of any one of Examples AA1-AA4 can optionally include where the radiation sensitive device is sensitive to electromagnetic interference and/or radio-frequency interference.

In Example AA6, the subject matter of any one of Examples AA1-AA5 can optionally include where the one or more ground coupling mechanisms are electrically conductive and mechanically compliant.

In Example AA7, the subject matter of any one of Examples AA1-AA6 can optionally include where the radiation sensitive device is part of a system on a chip package.

Example M1 is a method including creating a ground on a substrate around a radiation source on the substrate, adding one or more ground coupling mechanisms to a heat spreader, and coupling the heat spreader to the radiation source, where the one or more ground coupling mechanisms are in contact with the ground on the substrate.

In Example M2, the subject matter of Example M1 can optionally include where the one or more ground coupling mechanisms in contact with the ground on the substrate create a radiation shield that at least partially keeps radiation from the radiation source from extending past the substrate.

In Example M3, the subject matter of any one of the Examples M1-M2 can optionally include where the one or more ground coupling mechanisms that are in contact with the ground on the substrate create a Faraday cage around the radiation source.

In Example M4, the subject matter of any one of the Examples M1-M3 can optionally include where the ground is part of a stiffener for the substrate.

In Example M5, the subject matter of any one of the Examples M1-M4 can optionally include where the radiation source emits electromagnetic interference and/or radio-frequency interference.

In Example M6, the subject matter of any one of the Examples M1-M5 can optionally include where the radiation source is part of a system on a chip package.

What is claimed is:

1. An electronic device comprising:
   a substrate;
   a radiation source on the substrate;
   a ground on the substrate, wherein the ground is located around the radiation source; and
   a heat spreader over the radiation source, wherein the heat spreader includes one or more ground coupling mechanisms that are in contact with the ground on the substrate.

2. The electronic device of claim 1, wherein the one or more ground coupling mechanisms in contact with the ground on the substrate create a radiation shield that at least partially keeps radiation from the radiation source from extending past the substrate.

3. The electronic device of claim 1, wherein the one or more ground coupling mechanisms that are in contact with the ground on the substrate create a Faraday cage around the radiation source.

4. The electronic device of claim 1, wherein the ground is part of a stiffener for the substrate.

5. The electronic device of claim 1, wherein the radiation source emits electromagnetic interference and/or radio-frequency interference.

6. The electronic device of claim 1, wherein at least one specific ground coupling mechanism from the one or more ground coupling mechanisms is electrically conductive and can convert an input force at one area of the specific ground coupling mechanism to an output force at another area of the specific ground coupling mechanism through elastic body deformation.

7. The electronic device of claim 1, wherein the radiation source is part of a system on a chip package.

8. An electronic device comprising:
   a substrate;
   a radiation sensitive device on the substrate;
   a ground on the substrate, wherein the ground is located around the radiation sensitive device; and
   a heat spreader over the radiation sensitive device, wherein the heat spreader includes one or more ground coupling mechanisms that are in contact with the ground on the substrate.

9. The electronic device of claim 8, wherein the one or more ground coupling mechanisms in contact with the ground on the substrate create a radiation shield that at least partially keeps radiation from a radiation source from the radiation sensitive device.

10. The electronic device of claim 8, wherein the one or more ground coupling mechanisms that are in contact with the ground on the substrate create a Faraday cage around the radiation sensitive device.

11. The electronic device of claim 8, wherein the ground is part of a stiffener for the substrate.

12. The electronic device of claim 8, wherein the radiation sensitive device is sensitive to electromagnetic interference and/or radio-frequency interference.

13. The electronic device of claim 8, wherein at least one specific ground coupling mechanism from the one or more ground coupling mechanisms is electrically conductive and can convert an input force at one area of the specific ground coupling mechanism to an output force at another area of the specific ground coupling mechanism through elastic body deformation.

14. The electronic device of claim 8, wherein the radiation sensitive device is part of a system on a chip package.

15. A method comprising:
   creating a ground on a substrate around a radiation source on the substrate;
   adding one or more ground coupling mechanisms to a heat spreader; and
   coupling the heat spreader to the radiation source, wherein the one or more ground coupling mechanisms are in contact with the ground on the substrate.

16. The method of claim 15, wherein the one or more ground coupling mechanisms in contact with the ground on the substrate create a radiation shield that at least partially keeps radiation from the radiation source from extending past the substrate.

17. The method of claim 15, wherein the one or more ground coupling mechanisms that are in contact with the ground on the substrate create a Faraday cage around the radiation source.

18. The method of claim 15, wherein the ground is part of a stiffener for the substrate.

19. The method of claim 15, wherein the radiation source emits electromagnetic interference and/or radio-frequency interference.

20. The method of claim 15, wherein the radiation source is part of a system on a chip package.

* * * * *